United States Patent [19]
Heffner et al.

[11] Patent Number: 5,877,093
[45] Date of Patent: Mar. 2, 1999

[54] PROCESS FOR COATING AN INTEGRATED CIRCUIT DEVICE WITH A MOLTEN SPRAY

[75] Inventors: Kenneth H. Heffner; Curtis W. Anderson, both of Largo, Fla.

[73] Assignee: Honeywell Inc., Minneapolis, Minn.

[21] Appl. No.: 549,351

[22] Filed: Oct. 27, 1995

[51] Int. Cl.$^6$ .................................................. H01L 21/56
[52] U.S. Cl. ...................... 438/761; 438/763; 438/782; 438/785; 438/780
[58] Field of Search .................................... 438/763, 780, 438/782, 785, 761

[56] References Cited

U.S. PATENT DOCUMENTS

| | | |
|---|---|---|
| 3,844,729 | 10/1974 | Sedlatschek et al. . |
| 4,486,945 | 12/1984 | Aigoo . |
| 4,962,152 | 10/1990 | Leempoel . |
| 4,963,751 | 10/1990 | Kano et al. . |
| 5,053,992 | 10/1991 | Gilberg et al. . |
| 5,057,900 | 10/1991 | Yamazaki . |
| 5,208,467 | 5/1993 | Yamazaki . |
| 5,227,111 | 7/1993 | Brangers et al. . |
| 5,258,334 | 11/1993 | Lantz II . |
| 5,285,967 | 2/1994 | Weidman . |
| 5,302,671 | 4/1994 | Cifuentes et al. . |
| 5,352,491 | 10/1994 | Cifuentes et al. . |
| 5,399,441 | 3/1995 | Bearinger et al. . |
| 5,420,222 | 5/1995 | Stepp et al. . |
| 5,425,947 | 6/1995 | Hautekeer et al. . |
| 5,451,814 | 9/1995 | Yoshimizu . |
| 5,710,203 | 1/1998 | Camilletti et al. . |
| 5,720,818 | 2/1998 | Donde et al. . |

*Primary Examiner*—David Graybill
*Attorney, Agent, or Firm*—Thomas A. Rendos; Robert E. Greenstien

[57] ABSTRACT

Disclosed is a method of forming a primer coating and an opaque coating on an integrated circuit or multichip module. First a primer coating composition is applied to a surface of the integrated circuit device or multichip module to form a primer coating that increases the resistance of the surface to thermal and mechanical damage that may occur as a result of the application of the opaque coating. An opaque coating composition is then heated to a molten state and the molten opaque coating composition is applied over the primer coating to form an opaque coating that overlies active circuitry on the surface, to prevent optical and radiation based inspection and reverse engineering of the active circuitry.

6 Claims, 2 Drawing Sheets

PROCESS FOR COATING AN INTEGRATED CIRCUIT DEVICE WITH A MOLTEN SPRAY

BACKGROUND OF THE INVENTION

This invention relates to opaque coatings for electronic devices. In particular, the present invention is an opaque protective coating with primer and method of applying the coating and primer to integrated circuits and multichip modules. The coating and primer inhibit inspection and reverse engineering of integrated circuits and multichip modules.

Opaque coatings and methods of applying opaque coatings to electronic devices to inhibit inspection and reverse engineering are generally known. U.S. Pat. No. 5,399,441 to Bearinger et al. discloses one such method of forming an opaque coating on an integrated circuit. In Bearinger et al., an opaque ceramic coating is formed on an integrated circuit by a process which includes selectively applying a coating composition comprising a silica precursor resin and a filler onto the surface of the integrated circuit. A liquid mixture that includes the silica precursor resin and the filler is selectively applied to the integrated circuit by (1) masking the circuit, applying the liquid mixture and removing the mask, (2) selectively "painting" the circuit or (3) silk screening the circuit.

The coated integrated circuit is then heated at a temperature sufficient to convert the coating composition (i.e., liquid mixture) to a silica containing ceramic matrix having the filler distributed therein. Preferably, the integrated circuit with coating composition thereon is heated in a Lindberg furnace at a temperature within the range of about 50° C. to 425° C. for generally up to six (6) hours, with less than about three (3) hours being preferred, to convert the coating composition to a silica containing ceramic matrix. In Bearinger et al. the preferred silica precursor resin is hydrogen silsesquioxane resin (H-resin). To achieve a coating opaque to radiation, a filler comprising insoluble salts of heavy metals is combined with the silica precursor resin. To achieve a coating impenetrable to visual light, an optically opaque filler is combined with the silica precursor resin.

Because the method of applying the opaque coating to an integrated circuit of Bearinger et al. requires an extensive heating time period to transform the coating composition to a silica containing ceramic matrix, Bearinger et al.'s method is not particularly cost effective or efficient on a mass production level. In addition, the process of Bearinger et al. may not be usable with all types of integrated circuits since the method by which the opaque coating is applied and the extensive heating required to cure the opaque coating may cause mechanical and/or thermal damage to those integrated circuits having extremely delicate electronics. Also, the Bearinger, et al coating does not provide full protection since the liquid mixture is applied to the integrated circuit at the wafer level and before assembly of the actual devices into integrated circuit or multichip module packages. Therefore, protection is not provided for packaging components such as wire bonds, bond pads, and interconnects.

The U.S. Pat. No. 5,258,334 to Lantz, II discloses another process of applying an opaque ceramic coating to an integrated circuit. In Lantz, II, visual access to the topology of an integrated circuit is denied via an opaque ceramic produced by first mixing opaque particulate with a silica precursor. This mixture is then applied to the surface of the integrated circuit. The coated integrated circuit is then heated to a temperature in the range of 50° C. to 450° C. in an inert environment for a time within the range of one (1) second to six (6) hours to allow the coating to flow across the surface of the integrated circuit without ceramifying. The coated integrated circuit is then heated to a temperature in the range of 20° C. to 1000° C. in a reactive environment for a time in the range of two (2) to twelve (12) hours to allow the coating to ceramify. As with the above described Bearinger et al. patent, the method of applying the opaque coating of Lantz, II is time consuming and therefore not particularly cost effective or efficient on a mass production level. In addition, the process of Lantz, II may not be usable with all types of integrated circuits for the same reasons as outlined above in regards to the Bearinger et al.'s process. Likewise, as with the above described Bearinger et al. patent, the resulting coating does not provide full protection since the liquid mixture is applied to the integrated circuit at the wafer level and before assembly of the actual devices into integrated circuit or multichip module packages. Therefore, protection is not provided for packaging components such as wire bonds, bond pads, and interconnects.

There is a need for improved protective coatings for integrated circuits and multichip modules. In particular, there is a need for an improved protective coating that is both radiopaque and optically opaque to prevent inspection and/or reverse engineering of the topology of the integrated circuits and multichip modules. The protective coating should be capable of being applied to even electronically delicate integrated circuits and multichip modules without causing thermal and/or mechanical damage to the integrated circuits and multichip modules. In addition, the protective coating should be capable of being applied to integrated circuits and multichip modules in a time efficient and cost effective process to permit coating application on a mass production level. Finally, there is a need to apply the protective coatings to the wire bond and interconnects in integrated circuit and multichip module packages. These areas are unprotected using a wafer level coating.

SUMMARY OF THE INVENTION

The present invention is an opaque coating and a method of forming an opaque coating on a semiconductor integrated circuit device. To form the opaque coating on the integrated circuit device a first coating composition and a second different coating composition are prepared. The first coating composition is then applied to the surface of the semiconductor integrated circuit device to form a first coating. The second coating composition is then heated to a temperature sufficient to transform the second coating composition to a molten state. Next, the second molten coating composition is applied over the first coating on the surface of the integrated circuit device to form an opaque coating that overlies active circuitry on the surface so as to prevent optical and radiation based inspection and reverse engineering of the active circuitry.

This protective opaque coating can be applied to semiconductor integrated circuit devices, such as integrated circuits and multichip modules, in a time efficient and cost effective process to permit coating application on a mass production level. The primer coating allows the protective opaque coating to be applied to even electronically delicate semiconductor integrated circuit devices without causing thermal and/or mechanical damage to the semiconductor integrated circuit devices. Both the primer and protective opaque coating can be applied in whole or in part to assembled integrated circuit and multichip module devices including wire bonds and interconnects.

DETAILED DESCRIPTION OF THE PREFERRED EMBODIMENT

Figure 1:
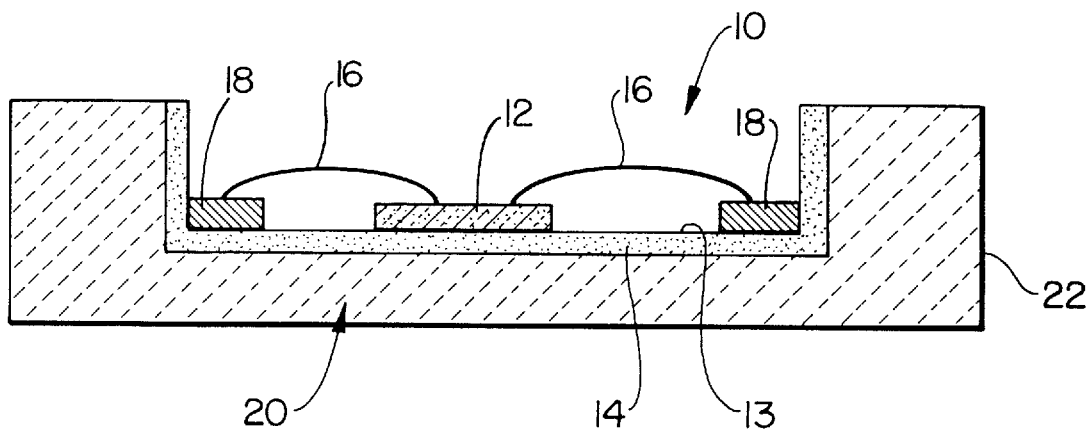
FIG. 1 is a sectional view of an integrated circuit or multichip module prior to the application of an organic primer coating and a protective opaque coating in accordance with the present invention.

A semiconductor integrated circuit device, such as an integrated circuit (IC) or multichip module (MCM) 10 to be coated in accordance with the present invention is illustrated generally in FIG. 1. The IC or MCM 10 includes a single, active circuitry semiconductor chip 12 (in the case of an IC) or multiple, active circuitry semiconductor chips 12 (in the case of a MCM). The semiconductor chip(s) 12 is mounted on a surface 13 of a substrate 14 and includes lead wires 16 that are connected to pads 18 also mounted on the surface 13 of the substrate 14. The pads 18 serve as ports for electrical connection to external sources (not shown). The substrate 14 with the chip(s) 12 and pads 18 mounted thereto is housed within a ceramic package 20 defined by a base member 22, a lid member 24 and a lid seal 26 (the lid member 24 and lid seal 26 not being shown in FIG. 1.).

Figure 3:
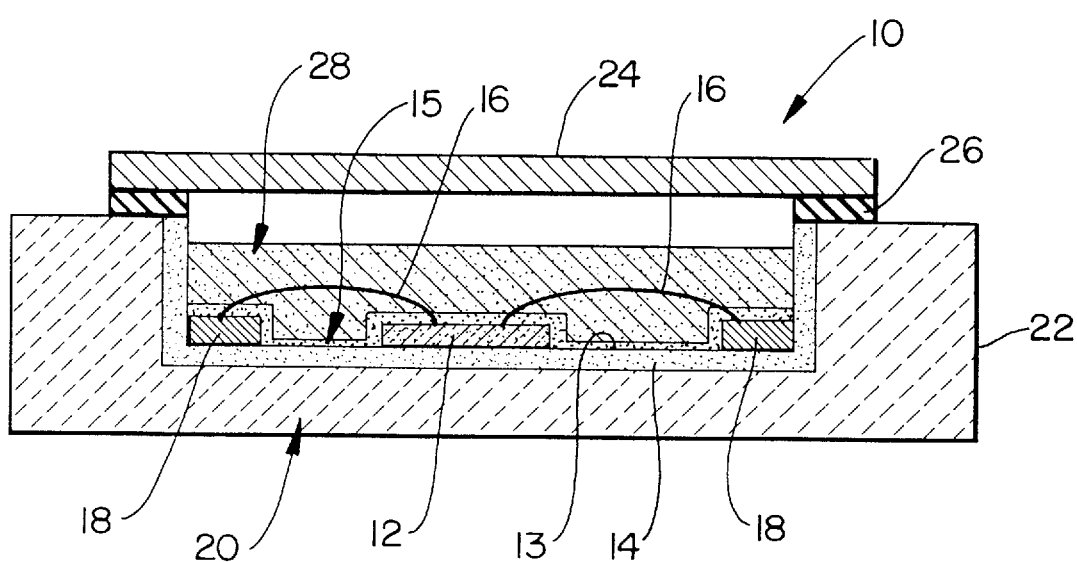
FIG. 3 is a sectional view similar to FIG. 1 of the integrated circuit or multichip module with the organic primer coating and protective opaque coating applied thereto.

The IC or MCM 10 of FIG. 1, in accordance with the present invention, is first coated with an organic based film, primer coating 15 (see FIG. 3) that is applied by way of reactive vacuum deposition, thermal spray or liquid coating process. Before the primer coating 15 is applied, a primer coating composition that defines the primer coating 15 is prepared. The primer coating composition is prepared from chemical materials that are compatible with the materials from which the IC or MCM 10 is manufactured. In the present invention, the primer coating composition may be Parylene, a solid thermoplastic, a solid siloxane or a furfural based liquid polymer. In one preferred embodiment, the primer coating composition is Parylene. In another preferred embodiment, the primer coating composition is siloxane. Once prepared, the primer coating composition is applied to the IC or MCM 10 devices using reactive vacuum deposition for Parylene, thermal spray deposition (as described later) for thermoplastic and siloxanes and liquid drop deposition for the furfural based polymer. As seen in FIG. 3, the formed primer coating 15 completely covers the semiconductor chip(s) 12, lead wires 16, pads 18 and the surface 13 of the substrate 14 housed within the base member 22. However, the primer 15 may be applied so as to only partially or completely cover any one of or more of the semiconductor chip(s) 12, leads 16, pads 18 and/or surface 13. In the present invention, once formed, the primer coating 15 has a thickness within the range of 0.1 mils to 2 mils. In one preferred embodiment, the formed primer coating 15 has a thickness of 0.7 mils.

Figure 2:
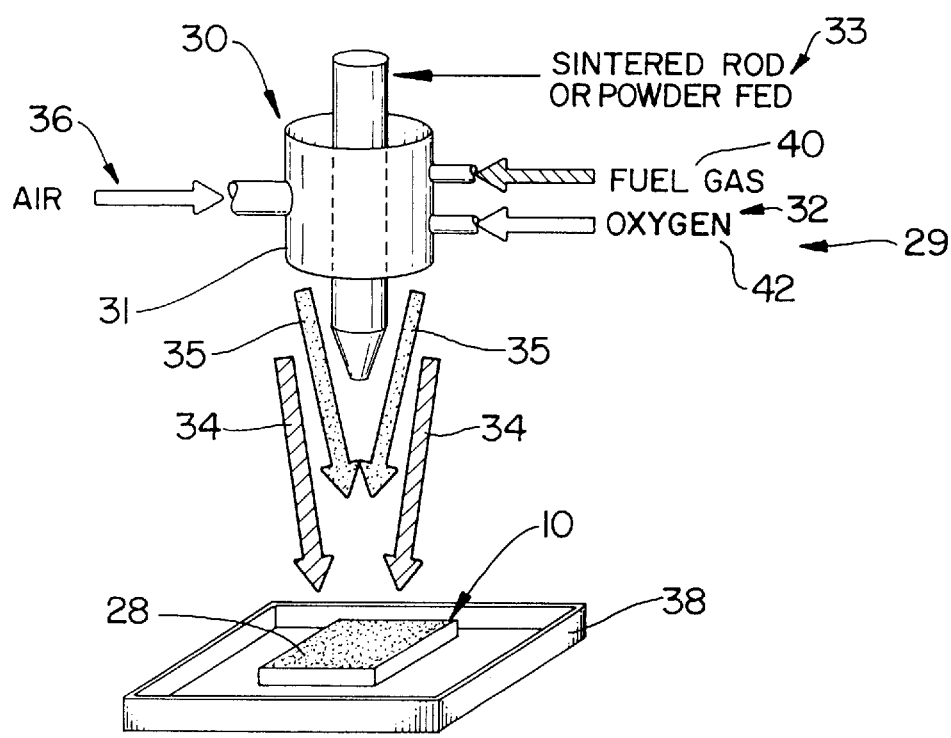
FIG. 2 is a schematic elevational view of the protective opaque coating being applied to the integrated circuit or multichip module shown in FIG. 1.

After the primer coating 15 is applied and allowed to form (i.e., cure), the IC or MCM 10 is then coated with a protective opaque coating 28 (see FIG. 3) by a thermal spray process 29 illustrated in FIG. 2. The thermal spray process 29, of the present invention, is a line of sight coating process that includes a thermal spray gun 30 having a nozzle 31. A heat energy source 32 is delivered to the nozzle 31 (in a known manner) to heat a ceramic particle based coating composition 33 also delivered to the nozzle 31 (in a known manner). The heat energy source 32 uses a flame 34 to heat the coating composition 33 to a molten state defined by molten liquefied particles 35. The molten liquefied particles 35 defining the coating composition 33 are carried to the IC or MCM 10 by a carrier gas jet 36 also delivered to the nozzle 31 (in a known manner). The IC or MCM 10 is supported on a support element 38 that may act as heat sink during the coating process.

The primer coating 15 is applied before the protective opaque coating 28, to improve the resistance of the IC or MCM 10 to mechanical and/or thermal damage that may result from the molten liquefied particles 35 being driven toward the IC or MCM 10 (via carrier gas jet 36) and impacting the IC or MCM 10 at a high velocity. The primer coating 15 is provides protection particularly when the IC or MCM 10 is electronically delicate. For example, when the IC or MCM 10 has thin lead wires 16, weak bonding joints between the lead wires 16 the pads 18 and semiconductor chip(s) 12, and/or when the circuit architecture of the IC or MCM 10 is susceptible to thermal shock or impingement damage.

The thermal spray process 29 first requires the preparation of the ceramic particle based coating composition 33. It is desirable that the chemistry of the coating composition 33 (as well as the primer coating composition) be similar to the chemistry of the materials of the IC or MCM 10, such that attempted removal of the protective opaque coating 28 (formed from the coating composition 33) and the primer coating 15 from the IC or MCM 10 (for inspection and/or reverse engineering of the topology of the IC or MCM) via chemical methods will simultaneously destroy the IC or MCM 10. In the present invention, the coating composition 33 may be a single chemical component or a multi chemical component composition, partially or entirely formed from any one of alumina, beryllia, silica, silicon carbide, aluminum nitride, fused alumina-titanium oxide, fused alumina titanium dioxide and nylon, alumina titanium oxide and teflon, barium titanate, or other ceramic oxides or silicates. In one preferred embodiment fused alumina-titanium oxide was found to provide a desirable coating composition 33 for the protective opaque coating 28.

The coating composition 33 is prepared by manufacturing the chemical materials of the coating composition 33 into a powder or sintered rod having particle sizes within the range of ten microns to sixty microns. Particle sizes in excess of sixty microns tend to cause mechanical damage to the IC or MCM 10 due to that force at which the carrier gas jet 36 delivers the molten liquefied particles 35 to the IC or MCM 10. Particle sizes less than ten microns tend to cause transformation of the particle based coating composition 33 into a liquid stream (rather than molten liquefied particles 35) that may be difficult to control during the application process. In one preferred embodiment, a coating composition 33 prepared in the form of a sintered rod with the coating composition 33 having a particle size within the range of ten microns to twenty microns is desirable.

Once the coating composition 33 is prepared, the coating composition 33, the heat energy source 32 and the carrier gas jet 36 are simultaneously delivered to the nozzle 31 of the thermal spray gun 30. The heat energy source 32 can take the form of a plasma arc, an electric arc or a fuel gas. In one preferred embodiment, the heat energy source is a fuel gas 40 (preferably acetylene) which is combined with oxygen 42 to create that flame 34 that is of a temperature sufficient to transform the ceramic particle based coating composition 33 to molten liquefied particles 35. In one preferred embodiment, this temperature is in the range of between 200° C. and 3000° C. The molten liquefied particles 35 are applied to the IC or MCM 10 over the primer coating 15 via the carrier gas jet 36 which carries the molten liquefied particles 35 to the IC or MCM 10 and causes the particles 35 to impact upon the IC or MCM 10. The molten liquefied particles 35 undergo a "splat" upon impact with the surface of the IC or MCM 10, and then coalesce to form a contiguous coating that thickens with continued successive depositions of the molten liquefied particles 35 to form the lamellar protective opaque coating 28. In one preferred embodiment, the carrier gas jet 36 is pressurized nitrogen which is delivered to the nozzle 31 of the thermal spray gun 30 in the range 10–100 cfm.

As seen in FIG. 2, in practice, the nozzle 31 of the thermal spray gun 30 is positioned above the IC or MCM 10 which is held in place by the support element 38 which can draw heat away from the IC or MCM 10 during the application process. Typically, the nozzle 31 is positioned from the IC or MCM 10 within the range of between five inches and seven inches. In one preferred embodiment, the nozzle 31 is positioned six inches from the IC or MCM 10. The molten liquefied particles 35 can be applied over the primer coating 15 in successive layers or as a single burst depending upon the desired coating thickness and the thermal limitations of the IC or MCM 10. In one preferred embodiment, the thickness of the formed protective coating 28 is in the range of between 0.1 mil and 200 mils. The molten liquefied particles 35 are applied by moving the nozzle 31 of the thermal spray gun 30 back and forth over the surface of the IC or MCM 10, by moving the IC or MCM 10 relative to the nozzle 31, or by moving both the nozzle 31 and the IC or MCM 10 relative to one another. In one preferred embodiment, the nozzle 31 is moved relative to a stationary IC or MCM 10.

Once the molten liquefied particles 35 are applied over the primer coating 15, they form a lamellar protective opaque coating that adhesively bonds to the surface of the IC or MCM 10 and is abrasion resistant, provides a hermetic seal, and prevents both active and passive, chemical, optical and radiation based inspection and/or reverse engineering of the active and inactive circuitry of the IC or MCM 10. As seen in FIG. 3, the formed protective opaque coating 28 completely covers the semiconductor chip(s) 12, lead wires 16, pads 18 and the surface 13 of the substrate 14 housed within the base member 22. However, the protective, opaque coating 28 may be applied so as to only partially or completely cover any one of or more of the semiconductor chip(s) 12, leads 16, pads 18 and/or surface 13. Once the protective opaque coating 28 is formed, the lid seal 26 and the lid member 24 are mounted on the base member 22 to further hermetically seal the IC or MCM 10.

The primer coating composition can be applied and cured to the primer coating 15 (to achieve complete coverage as shown in FIG. 3) in 1 to 60 minutes. The molten liquefied particles 35 can be applied over the primer coating 15 on the surface of the IC or MCM 10 (to achieve complete coverage as shown in FIG. 3) in 15 to 600 seconds. The protective opaque coating 28 can be fully coated and cooled and the IC or MCM 10 ready for use in only 1 to 70 minutes. Therefore, the thermal spray process is capable of producing inspection and/or reverse engineering proof IC's or MCM's 10 in a time efficient and cost effective manner that permits coating application on a mass production level.

Although the present invention has been described with reference to preferred embodiments, workers skilled in the art will recognize that changes may be made in form and detail without departing from the spirit and scope of the invention.

We claim:

1. A method comprising:

preparing a first coating composition in the form of particles;

heating the first coating composition in flame to transform the particles into molten droplets and injecting air into the flame to propel the droplets into a spray;

directing the spray of the molten droplets of the first coating on a surface of the semiconductor integrated circuit device to form a first coating on the surface when the molten particles cool on the surface;

preparing a second coating composition in the form of particles;

heating the second coating composition in a flame to transform the particles of the second coating composition into molten droplets and injecting air into the flame to propel the droplets of the second coating into a spray; and directing the spray of the molten droplets of the second coating over the first coating.

2. The method described in claim 1, wherein:

the first coating composition is solid thermoplastic.

3. The method described in claim 1, wherein:

the first coating composition is solid siloxane.

4. The method described in claim 1, wherein:

the first coating composition is furfural based liquid polymer.

5. The method described in claim 1, wherein:

the second coating composition is selected from the group comprising alumina, barium titanate, and fused alumina-titanium oxide.

6. The method described in claim 5, wherein:

the second coating composition comprises a polymer.

* * * * *

UNITED STATES PATENT AND TRADEMARK OFFICE
CERTIFICATE OF CORRECTION

PATENT NO.   : 5,877,093
DATED        : March 2, 1999
INVENTOR(S)  : Kenneth H. Heffner et al.

It is certified that error appears in the above-identified patent and that said Letters Patent is hereby corrected as shown below:

Column 1,
Line 3, insert -- The United States Government may have certain rights to this invention under government contract MDA904-92-C-7066. --

Signed and Sealed this

Thirty-first Day of May, 2005

JON W. DUDAS
*Director of the United States Patent and Trademark Office*